United States Patent [19]
Lee

[11] Patent Number: 5,866,450
[45] Date of Patent: Feb. 2, 1999

[54] METHOD FOR FABRICATING CROWN-SHAPED DRAM CAPACITOR

[75] Inventor: Jin-Hwa Lee, Taipei, Taiwan

[73] Assignee: United Microelectronics Corp., Taipei, Taiwan

[21] Appl. No.: 991,621

[22] Filed: Dec. 16, 1997

[30] Foreign Application Priority Data

Sep. 20, 1997 [TW] Taiwan ................................. 86113671

[51] Int. Cl.$^6$ .............................................. H01L 21/8242
[52] U.S. Cl. ........................... 438/239; 438/254; 438/397
[58] Field of Search .................................... 438/238, 239, 438/253–256, 381, 396–399

[56] References Cited

U.S. PATENT DOCUMENTS

| | | | |
|---|---|---|---|
| 5,429,977 | 7/1995 | Lu et al. ..................................... | 437/47 |
| 5,476,806 | 12/1995 | Roh et al. ................................... | 437/52 |
| 5,712,202 | 1/1998 | Liaw et al. ............................... | 438/253 |

Primary Examiner—Joni Chang
Attorney, Agent, or Firm—Finnegan, Henderson, Farabow, Garrett & Dunner, L.L.P.

[57] ABSTRACT

A method for fabricating a crown-shaped DRAM capacitor comprising the steps of providing a substrate having transistors already formed thereon, then sequentially forming a first insulating layer and a second insulating layer over the substrate and the transistors. The second insulating layer has an upper opening that exposes portions of the first insulating layer, and the first insulating layer has a contact opening that exposes a source/drain region in the substrate. Thereafter, a first conducting layer is formed over the second insulating layer and the exposed first insulating layer. Then, spacers are formed on the sidewalls of the first conducting layer. Next, a second conducting layer is deposited over the first conducting layer and the spacers. Subsequently, the second conducting layer is etched to form conducting pillars next to the spacers. Finally, the spacers and the second insulating layer are removed to form a crown-shaped lower electrode for the capacitor. This invention allows a lower electrode having a large surface area. Therefore, a capacitor with high capacitance is obtained.

23 Claims, 4 Drawing Sheets ial layer has a larger surface area of the electrode and hence large capacitance. However, etching # METHOD FOR FABRICATING CROWN-SHAPED DRAM CAPACITOR

BACKGROUND OF THE INVENTION

1. Field of Invention

The present invention relates to a method for fabricating semiconductor devices. More particularly, the present invention relates to a method for fabricating a crown-shaped dynamic random access memory (DRAM) capacitor.

2. Description of Related Art

DRAMs are now extensively used in all kinds of integrated circuit devices. They have become an indispensable element in the electronic industries. FIG. 1 illustrates a circuit diagram of a memory unit of a DRAM device. As shown in FIG. 1, the memory unit comprises a pass transistor T and a storage capacitor C. The source terminal of the pass transistor T is connected to a bit line (BL) and the drain terminal is connected to a storage electrode 6 of the storage capacitor C. The gate terminal of the pass transistor T is connected to a word line (WL). The opposed electrode 8 of the storage capacitor C is connected to a fixed voltage source. Between the storage electrode 6 and the opposed electrode 8, there is a dielectric layer 7. Those who are familiar with the art of semiconductor manufacturing may know that the capacitor C functions as a storage place for digital data. Therefore, the capacitor C should have a sufficiently large capacitance to avoid rapid data loss.

In the fabrication of conventional DRAMs with a memory capacity up to about 1 MB, a two dimensional capacitor device, generally known as a planar-type capacitor, is often employed for storing digital data. In a conventional planar-type DRAM capacitor, as shown in FIG. 2, a silicon substrate 10 is provided first. Then, a field oxide layer 11 is formed on the substrate 10 to define the active regions. Next, a gate oxide layer 12, a gate layer 13 and source/drain regions 14 are sequentially formed above the substrate 10, constituting a pass transistor T. In a subsequent step, a dielectric layer 7 and a conducting layer 8 are sequentially formed over portions of the substrate 10 near the drain terminal. The region 6 where the dielectric layer 7 and the conducting layer 8 overlap the substrate 10 forms a storage capacitor C. For the planar-type capacitor structure described, a relatively large surface area is required to form a storage capacitor C that has sufficient capacitance. Hence, this design is unsuitable for DRAM devices with high-level integration.

In general, highly integrated DRAMs, for example, those larger than about 4 MB memory capacity, require a three-dimensional capacitor structure, such as a stack-type or a trench-type structure, for the capacitor devices.

FIG. 3 is a cross-sectional view of a conventional stack-type capacitor structure. As shown in FIG. 3, a field oxide layer 11, a gate oxide layer 12, a gate layer 13 and source/drain regions 14 are sequentially formed on a substrate 10, which constitute a pass transistor T. Thereafter, an insulating layer 15 is formed on the substrate 10, then a contact opening 14 is etched out exposing portions of the source/drain region 14. Subsequently, a polysilicon layer 6 (serving as the storage electrode), a dielectric layer 7 and a conducting layer 8 (serving as the opposed electrode) are sequentially formed over the contact opening 14. This produces a stack-type DRAM capacitor memory unit. The above stack-type capacitor structure is capable of supplying sufficiently large capacitance with relatively good device reliability. However, for higher level of integration, such as a 64 MB or larger storage capacity DRAM, a simple stack-type capacitor is insufficient.

Another technique for increasing the capacitance is to produce a trench-type capacitor. FIG. 4 is a cross-sectional view of a conventional trench-type capacitor structure. As shown in FIG. 4, processes very similar to those used in the fabrication of a stack-type capacitor are performed first to produce a pass transistor T on a silicon substrate 10. The pass transistor T includes a gate oxide layer 12, a gate layer 13 and source/drain regions 14. Thereafter, a deep trench is formed by etching the substrate 10 near the drain terminal 14, and a storage capacitor C is formed inside the trench region. The storage capacitor C is formed on the sidewalls of the trench. The capacitor C comprises a storage electrode 6, a dielectric layer 7 and a polysilicon opposed electrode 8. The above trench-type capacitor has a larger surface area of the electrode and hence large capacitance. However, etching the substrate 10 to form a trench may cause some damages to the crystal lattice structure, and more current may leak, thereby affecting operation of the device. Furthermore, as an aspect ratio of the trench increases, the etching rate will correspondingly decrease; therefore, fabrication becomes more difficult and time consuming.

In light of the foregoing, there is a need for an improved method for fabricating a DRAM capacitor with larger capacitance.

SUMMARY OF THE INVENTION

Accordingly, the present invention provides a method for fabricating a crown-shaped DRAM capacitor that can maintain sufficient capacitance for a small planar surface area.

To achieve this and other advantages and in accordance with the purpose of the invention, as embodied and broadly described herein, the invention provides a method for fabricating a crown-shaped DRAM capacitor. The method includes the fabrication of a lower electrode, which comprises the steps of providing a substrate having transistors formed thereon, and sequentially forming a first insulating layer and a second insulating layer over the substrate and the transistors. The second insulating layer has an upper opening that exposes portions of the first insulating layer, and the first insulating layer has a contact opening that exposes the source/drain region in the substrate. In addition, the upper opening exposes the contact opening.

Next, a first conducting layer is formed over the second insulating layer and covering the sidewalls of the second insulating layer, the exposed first insulating layer of the upper opening and the exposed source/drain region through the contact opening. Thereafter, a first material is formed over the first conducting layer. Then, the first material layer is etched to form spacers on the sidewalls of the first conducting layer in the capacitor region. After that, a second conducting layer is formed over the first conducting layer and the spacers. Then, the second conducting layer is etched to form conducting pillars next to the spacers. Subsequently, the first conducting layer above the second insulating layer is etched to expose the second insulating layer. Then, the spacers are removed. Finally, the second insulating layer is also removed to expose the first insulating layer.

In this invention, the first insulating layer can be a silicon dioxide layer or a silicon nitride layer. Similarly, the second insulating layer can be a silicon dioxide layer or a silicon nitride layer, for example. Preferably, the first insulating layer and the second insulating layer are formed from different materials. However, the method of this invention need not be restricted herein. The first insulating layer and the second insulating layer can be formed from the same material. When both the first and the second insulating layers are made from the same material, a barrier layer over the first insulating layer is deposited before depositing the second insulating layer over the barrier layer. The barrier layer is sandwiched between the first and the second insulating layer. Therefore, the barrier layer can act as an etching stop layer during the etching of the second insulating layer, subjected to the condition that the etching stop layer and the second insulating layer are made from different materials. If the second insulating layer and the spacers are made from the same material, only one etching operation is required to remove the second insulating layer and the spacers instead of two.

This invention allows a lower electrode having a larger surface area. Therefore, a capacitor with higher capacitance can be obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
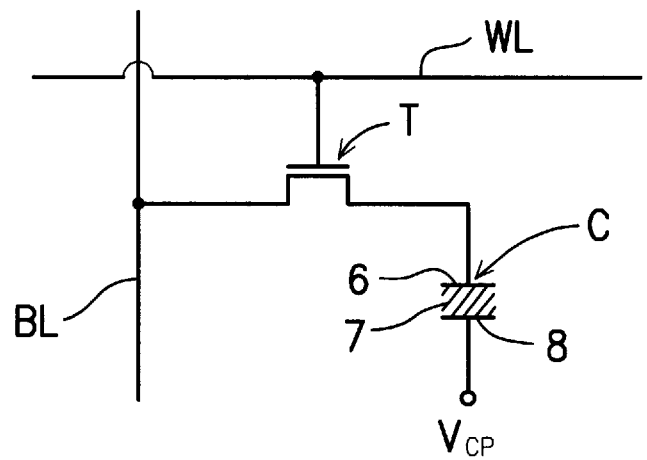
FIG. 1 is the circuit diagram of a memory unit of a DRAM device.
Figure 2:
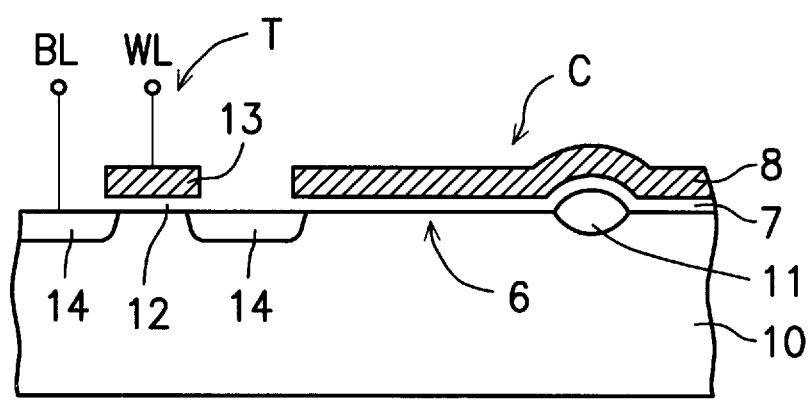
FIG. 2 is a cross-sectional view of a conventional planar-type DRAM capacitor.
Figure 3:
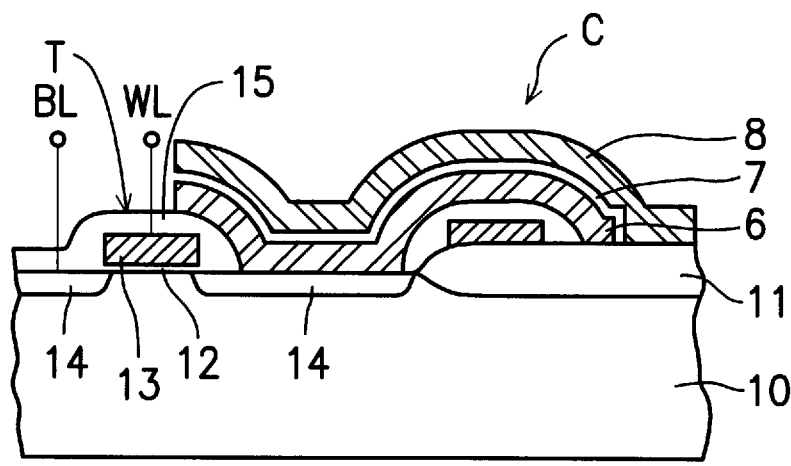
FIG. 3 is a cross-sectional view of a conventional stack-type capacitor structure.
Figure 4:
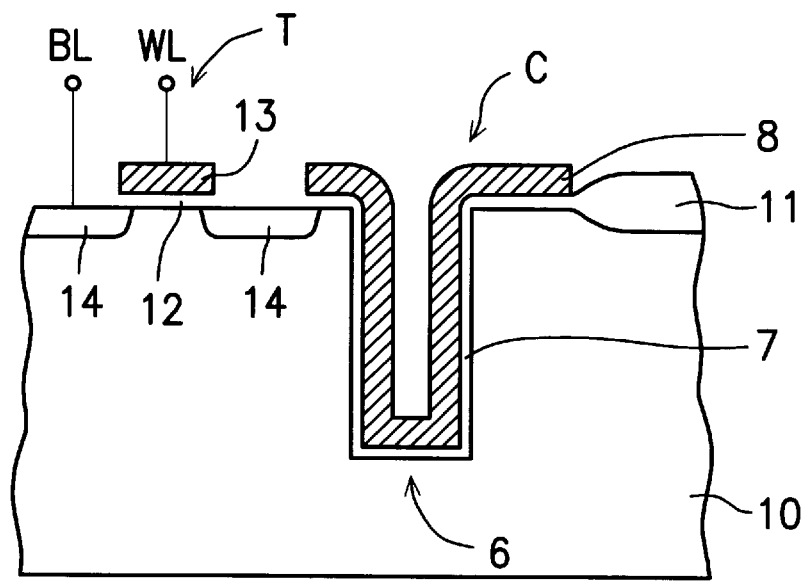
FIG. 4 is a cross-sectional view of a conventional trench-type capacitor structure.

Reference will now be made in detail to the present preferred embodiments of the invention, examples of which are illustrated in the accompanying drawings. Wherever possible, the same reference numbers are used in the drawings and the description to refer to the same or like parts.

Figure 5A:
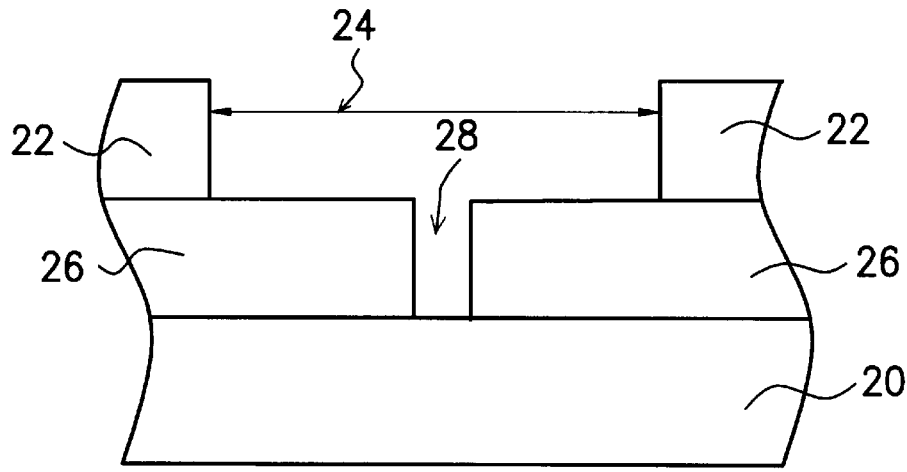
FIG. 5A through 5F are cross-sectional views showing the progression of manufacturing steps for forming a crown-shaped DRAM capacitor according to one preferred embodiment of this invention.

FIG. 5A through 5F are cross-sectional views showing the progression of manufacturing steps for forming a crown-shaped DRAM capacitor according to one preferred embodiment of this invention. First, as shown in FIG. 5A, a substrate 20 having a transistor (not shown) already formed thereon is provided. Then, a layer of first insulating material 26 is formed over the substrate 20 and the transistor using, for example, a low pressure chemical vapor deposition (LPCVD) method. Thereafter, a second layer of insulating material is formed over the layer of first insulating material. Next, the second layer of insulating material is patterned using a conventional photolithographic process, and then etched to form a second insulating layer 22 using the first layer of insulating material as an etching stop. The second insulating layer 22 has an opening 24 that exposes the first layer of insulating material. Subsequently, a conventional photolithographic process is again used to pattern the first layer of insulating material. Then, the first layer of insulating material is etched to form a first insulating layer 26 having a contact opening 28 that exposes the source/drain region (not shown) of the transistor above the substrate 20. The opening 24 has a width greater than the width of the contact opening 28, and the opening 24 together with the contact opening 28 form a T-shaped opening region.

In the preferred embodiment of this invention, the first insulating layer 26 can be a silicon dioxide layer or a silicon nitride layer. Similarly, the second insulating layer 22 can be a silicon dioxide layer or a silicon nitride layer. Preferably, the first insulating layer 26 and the second insulating layer 22 are formed from different materials. However, the method of this invention need not be so restricted. The first insulating layer 26 and the second insulating layer 22 can be formed from the same material. For example, the first insulating layer 26 and the second insulating layer 22 can both be silicon dioxide layers or silicon nitride layers. When both the first and the second insulating layers are made from the same material, a barrier layer over the first layer of insulating material is provided before depositing the second layer of insulating material over the barrier layer. Thus, the barrier layer is sandwiched between the first and the second layer of insulating material. Also, the barrier layer can act as an etching stop layer during the etching of the second layer of insulating material, subjected to the condition that the etching stop layer and the second insulating layer are made from different materials.

Figure 5B:
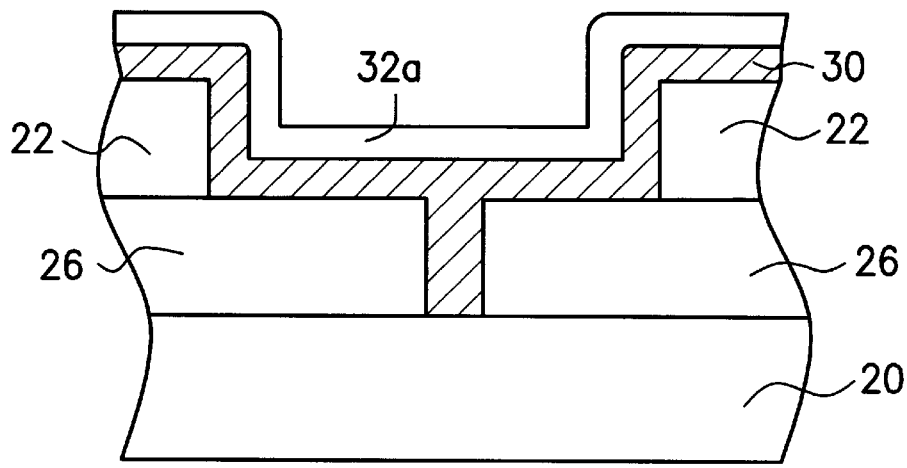

Next, as shown in FIG. 5B, a layer of conducting material is deposited over the second insulating layer 22, the sidewalls of the second insulating layer 22 and the exposed first insulating layer 26 in the opening 24, and the contact opening 28 covering the exposed source/drain region to form a first conducting layer 30. The first conducting material can be an impurity doped polysilicon layer preferably having a thickness of between 500 Å to 1500 Å, for example. Then, a layer of insulating material is deposited over the first conducting layer 30 to form a first material layer 32a by a low pressure chemical vapor deposition method. The first material layer 32a can be, for example, a silicon dioxide or a silicon nitride layer deposited with a preferable thickness of between 500 Å to 1500 Å.

Figure 5C:
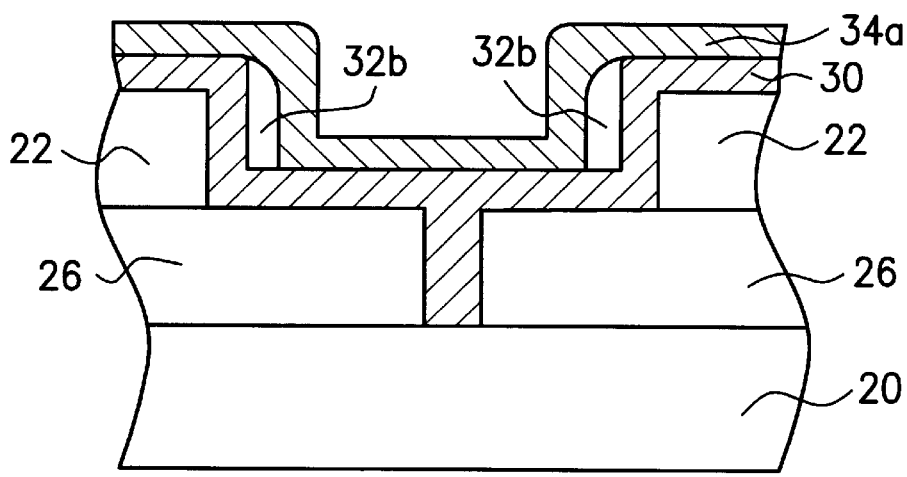

Next, as shown in FIG. 5C, the first material layer 32a is etched to form spacers 32b on the sidewalls of the first conducting layer 30 inside the opening 24 by an anisotropic etching method. Thereafter, using a similar method as for the deposition of the first conducting layer, a conducting material is deposited over the spacers 32b and the first conducting layer 30 to form a second conducting layer 34a. The conducting material can be an impurity doped polysilicon layer deposited with a thickness of about 500 Å to 1500 Å, for example.

Figure 5D:
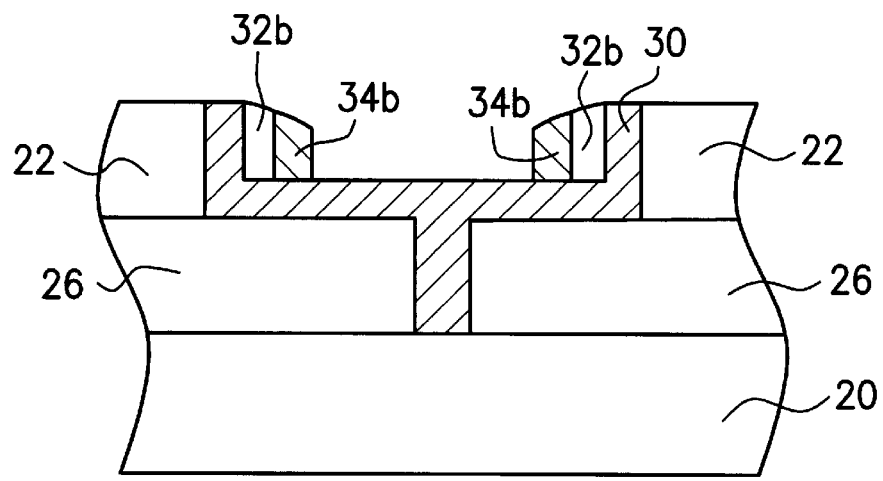

Next, as shown in FIG. 5D, the second conducting layer 34a is etched to form conducting pillars 34b next to the spacers 32b by an anisotropic etching method. The shape of the conducting pillars 34b resembles that of the spacers 32b. Next, a photoresist (not shown) is formed over the opening 24, and then the first conducting layer 30 above the second insulating layer 22 is etched to expose the second insulating layer 22. Subsequently, the photoresist layer is removed.

Figure 5E:
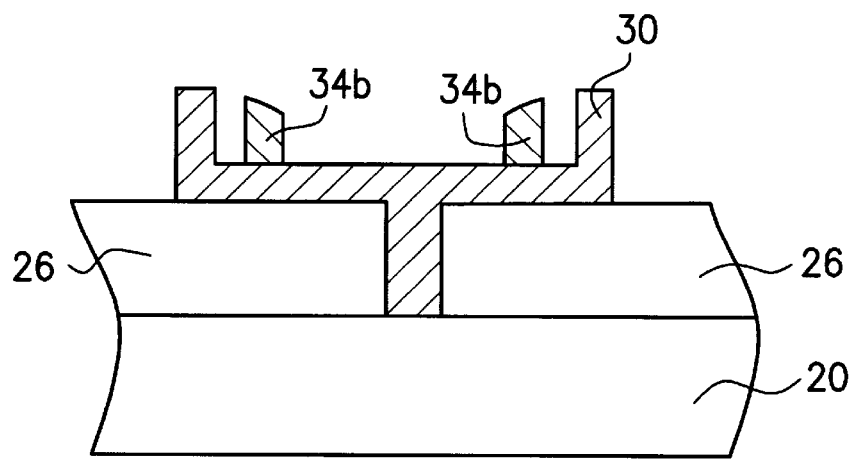

Next, as shown in FIG. 5E, the spacers 32b is removed using a selective etching method. The selective etching method has a high selectivity ratio between the spacers 32b on one hand and the first conducting layer 30 and the conducting pillars 34b on the other. In the selective etching, the etching rate of spacers 32b is faster while the etching rate for the conducting layer 30 and the conducting pillars 34b are slower. The selective etching can be conducted, for example, by a wet etching method. The conducting layer 30, together with the conducting pillars 34b, constitutes the lower electrode of the crown-shaped DRAM capacitor. Finally, the second insulating layer 22 is removed by a selective etching method similar to a method for removing the spacers 32b. The selective etching method has a high selectivity ratio between the second insulating layer 22 on one hand and the first conducting layer 30 and the conducting pillars 34b on the other. If the second insulating layer 22 and the spacers 32b are made from the same material, only one etching step is required for removing both the second insulating layer 22 and the spacers 32b.

Processes for completing the remainder of the crown-shaped capacitor are described in FIG. 5F below.

Figure 5F:
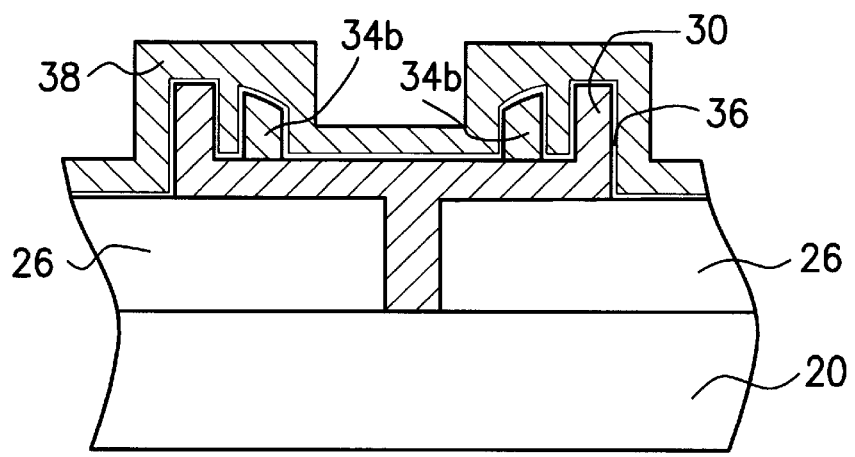

As shown in FIG. 5F, a dielectric layer 36 is deposited over the lower electrode. The dielectric layer 36 can be, for example, an oxide/nitride/oxide (ONO) three-layered composite structure, and is deposited by a low pressure chemical vapor deposition method. Next, a layer of conducting material is deposited over the dielectric layer 36 to form the upper electrode 38 of the capacitor. The conducting material can be impurity-doped polysilicon deposited by a low pressure chemical vapor deposition method, for example.

This invention allows a lower electrode with a large surface area; therefore, a capacitor with high capacitance can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a crown-shaped DRAM capacitor, comprising the steps of:

providing a substrate having a transistor, and sequentially forming a first insulating layer and a second insulating layer over the substrate and the transistor, wherein the second insulating layer has an upper opening exposing exposed portions of the first insulating layer, the first insulating layer has a contact opening exposing a source/drain region of the substrate, and the upper opening in the second insulating layer exposes the contact opening;

forming a first conducting layer over the second insulating layer, sidewalls of the second insulating layer, the exposed portions of the first insulating layer inside the upper opening and the contact opening leading to the source/drain region;

forming a first material layer over the first conducting layer covering the upper opening;

etching the first material layer to form spacers on the sidewalls of the first conducting layer lining the upper opening;

forming a second conducting layer over the first conducting layer and the spacers;

etching the second conducting layer to expose the spacers and forming conducting pillars adjacent the spacers;

etching the first conducting layer above the second insulating layer to expose the second insulating layer;

removing the spacers;

removing the second insulating layer to expose the first insulating layer to form a lower electrode;

forming a dielectric layer over the lower electrode; and forming an upper electrode over the dielectric layer.

2. The method of claim 1, wherein the upper opening has a width greater than a width of the contact opening.

3. The method of claim 1, wherein the upper opening and the contact opening together form a T-shaped opening area.

4. The method of claim 1, wherein the step of forming the first conducting layer includes low pressure chemical vapor deposition.

5. The method of claim 1, wherein the step of forming the first material layer includes a low pressure chemical vapor deposition.

6. The method of claim 1, wherein the step of etching the first material layer to form the spacers includes an anisotropic etching.

7. The method of claim 1, wherein the step of forming the second conducting layer includes a low pressure chemical vapor deposition.

8. The method of claim 1, wherein the step of etching the second conducting layer to form conducting pillars includes anisotropic etching.

9. The method of claim 1, wherein the step of etching the first conducting layer to expose the second insulating layer includes anisotropic etching.

10. The method of claim 1, wherein the step of removing the spacers includes a selective etching method that has a high selectivity ratio between the spacers and the first conducting layer and conducting pillars.

11. The method of claim 10, wherein a rate of etching of the spacers in the selective etching step is faster.

12. The method of claim 10, wherein a rate of etching of the conducting pillars and first conducting layer in the selective etching step is slower.

13. The method of claim 1, wherein the step of removing the second insulating layer includes a selective etching method that has a high selectivity ratio between the second insulating layer and the first conducting layer and conducting pillars.

14. The method of claim 13, wherein a rate of etching of the second insulating layer in the selective etching step is faster.

15. The method of claim 13, wherein a rate of etching of the first conducting layer and conducting pillars in the selective etching step is slower.

16. The method of claim 1, wherein the step of forming the first conducting layer includes impurity-doped polysilicon deposition.

17. The method of claim 1, wherein the first conducting layer has a thickness between 500 Å to 1500 Å.

18. The method of claim 1, wherein the step of forming the first material layer includes silicon dioxide deposition.

19. The method of claim 1, wherein the step of forming the first material layer includes silicon nitride deposition.

20. The method of claim 1, wherein the step of forming the second conducting layer includes impurity-doped polysilicon deposition.

21. The method of claim 1, wherein the second conducting layer has a thickness between 500 Å to 1500 Å.

22. The method of claim 1, wherein the step of forming the dielectric layer includes sequential deposition of an oxide layer, a nitride layer and an oxide layer forming a three-layered composite stack structure.

23. The method of claim 1, wherein the step of forming the upper electrode includes impurity-doped polysilicon deposition.

* * * * *